US007645685B2

(12) United States Patent
Ishizuka et al.

(10) Patent No.: US 7,645,685 B2
(45) Date of Patent: Jan. 12, 2010

(54) METHOD FOR PRODUCING A THIN IC CHIP USING NEGATIVE PRESSURE

(75) Inventors: Masaharu Ishizuka, Nagano (JP); Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 295 days.

(21) Appl. No.: 11/377,273

(22) Filed: Mar. 17, 2006

(65) Prior Publication Data

US 2007/0218648 A1 Sep. 20, 2007

(51) Int. Cl.
*H01L 21/00* (2006.01)

(52) U.S. Cl. .............. 438/460; 438/461; 438/462; 438/463; 438/464; 438/465; 438/118

(58) Field of Classification Search ......... 438/460–465, 438/118
See application file for complete search history.

(56) References Cited

U.S. PATENT DOCUMENTS

| 6,428,641 | B1* | 8/2002 | Yoon et al. ............ 156/64 |
| 7,253,238 | B2* | 8/2007 | Griswold et al. ......... 525/477 |
| 2005/0006482 | A1* | 1/2005 | Kano et al. ............ 235/488 |
| 2005/0095812 | A1* | 5/2005 | Derderian et al. ........ 438/458 |
| 2005/0148158 | A1* | 7/2005 | Van't Oever ............ 438/460 |
| 2006/0172509 | A1* | 8/2006 | Mahle et al. ............ 438/462 |

FOREIGN PATENT DOCUMENTS

| JP | 06-151265 A | 5/1994 |
| JP | 06-151657 A | 5/1994 |
| JP | 2001-127026 A | 5/2001 |

* cited by examiner

*Primary Examiner*—N Drew Richards
*Assistant Examiner*—Jae Lee
(74) *Attorney, Agent, or Firm*—Oliff & Berridge, PLC

(57) ABSTRACT

The present invention relates to a method for bonding a first thin plate having a first adhesion surface and a first back surface and a second thin plate having a second adhesion surface and a second back surface by an adhesive, the adhesive being sandwiched between said first adhesion surface and said second adhesion surface. The method comprises the steps of: applying said adhesive to said second adhesion surface of said second thin plate; holding said first thin plate by applying negative pressure to said first back surface, wherein said first thin plate is held at said first back surface, and said first adhesion surface faces downward; holding said second thin plate by applying negative pressure to said second back surface, wherein said second thin plate is held at said second back surface, and said second adhesion surface faces upward; temporarily bonding said first thin plate and said second thin plate by putting said first and second adhesion surfaces into contact with each other, wherein said first thin plate and said second thin plate are held by negative pressure; and bonding said first thin plate and said second thin plate by curing said adhesive, wherein said first thin plate and said second thin plate are temporarily bonded.

10 Claims, 10 Drawing Sheets

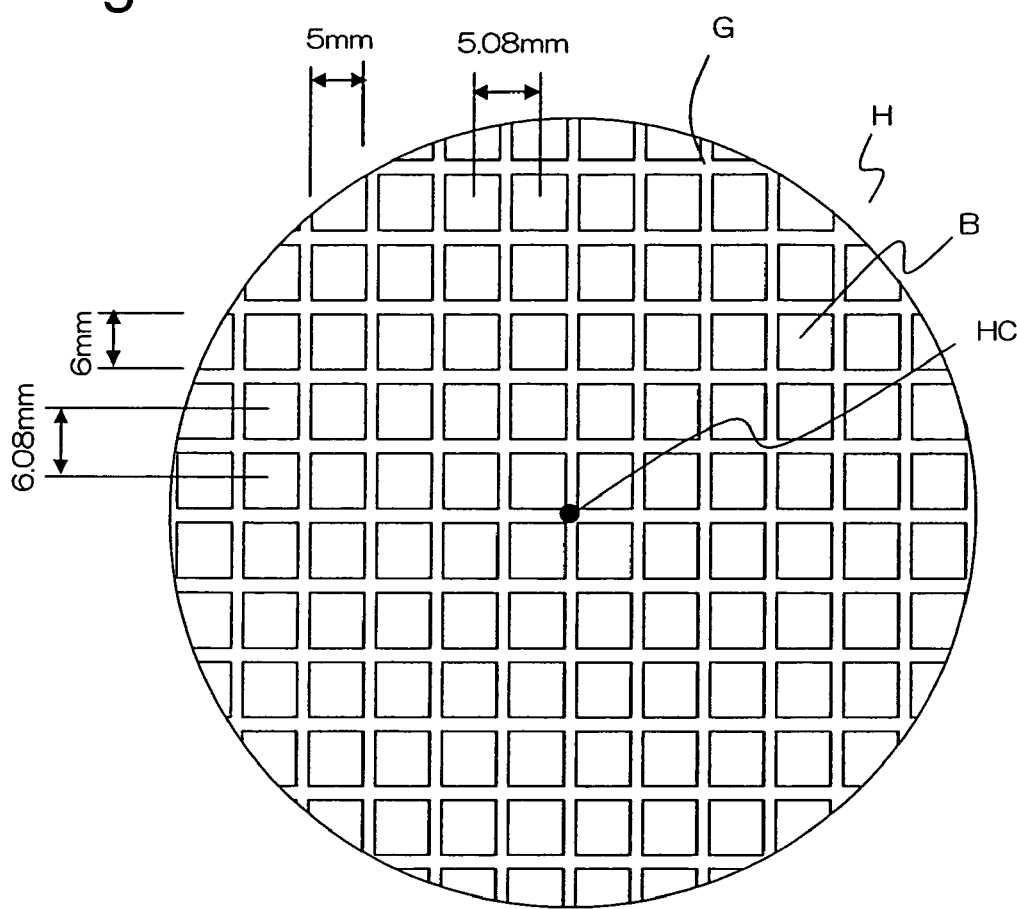

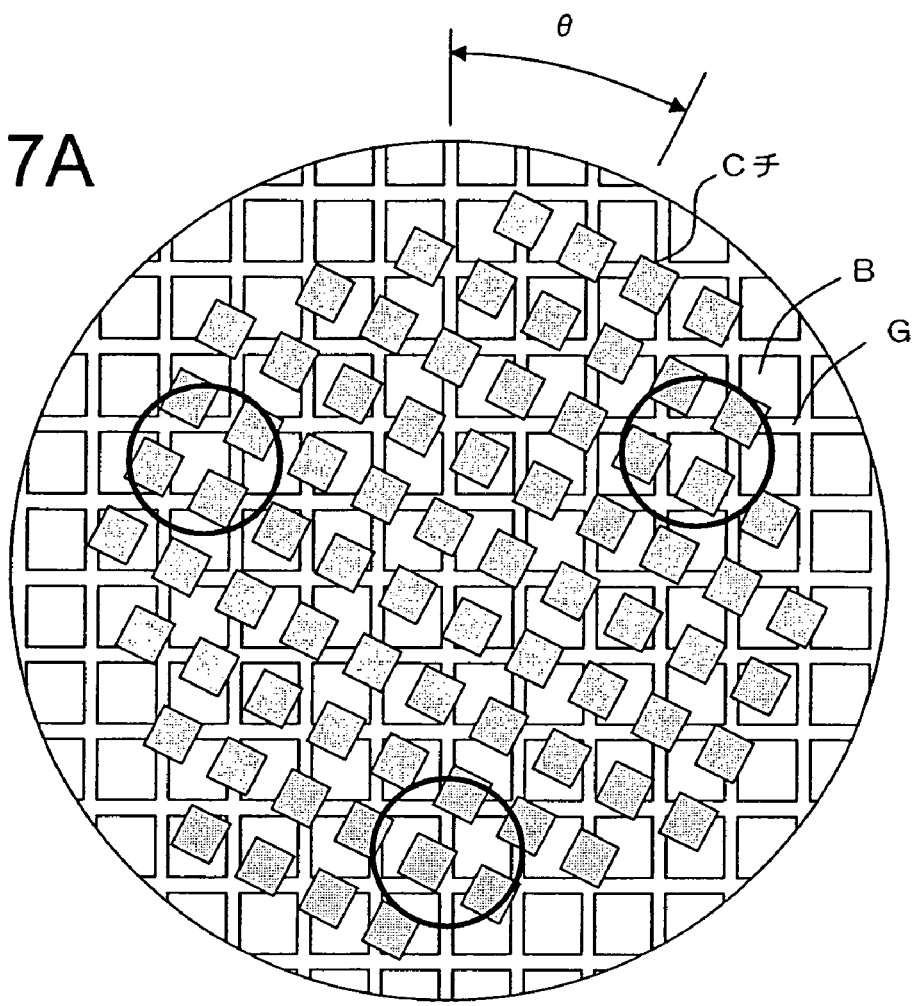

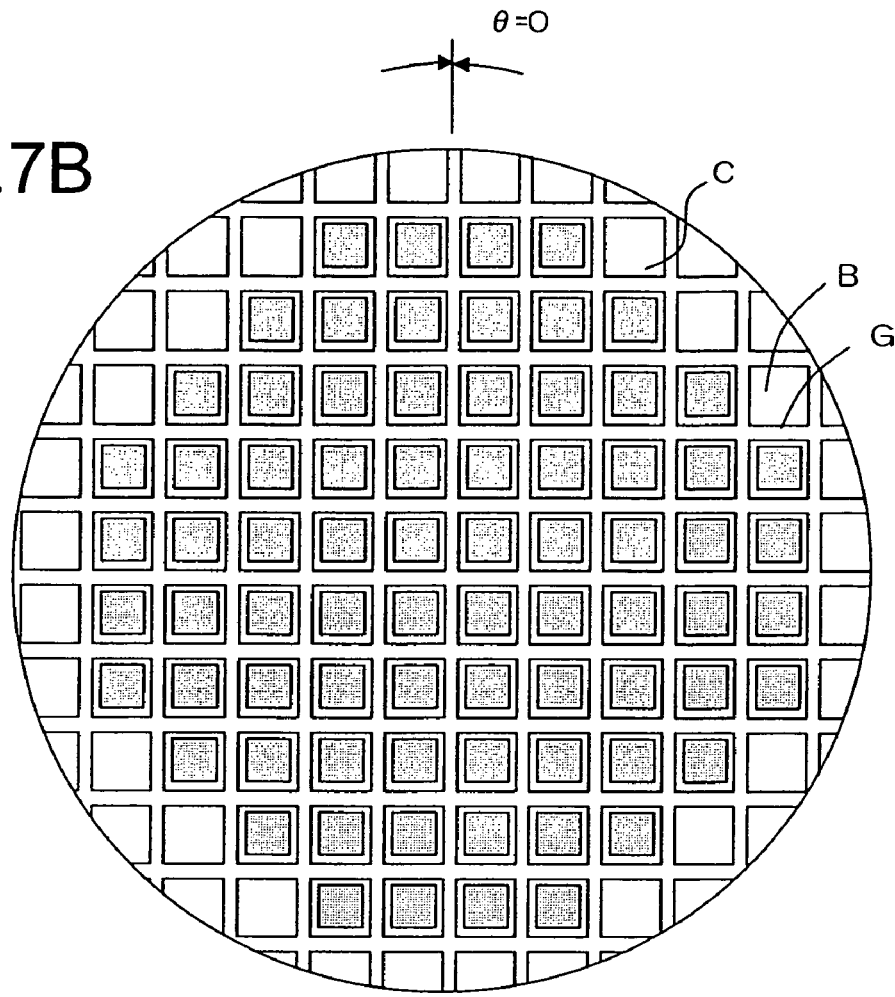

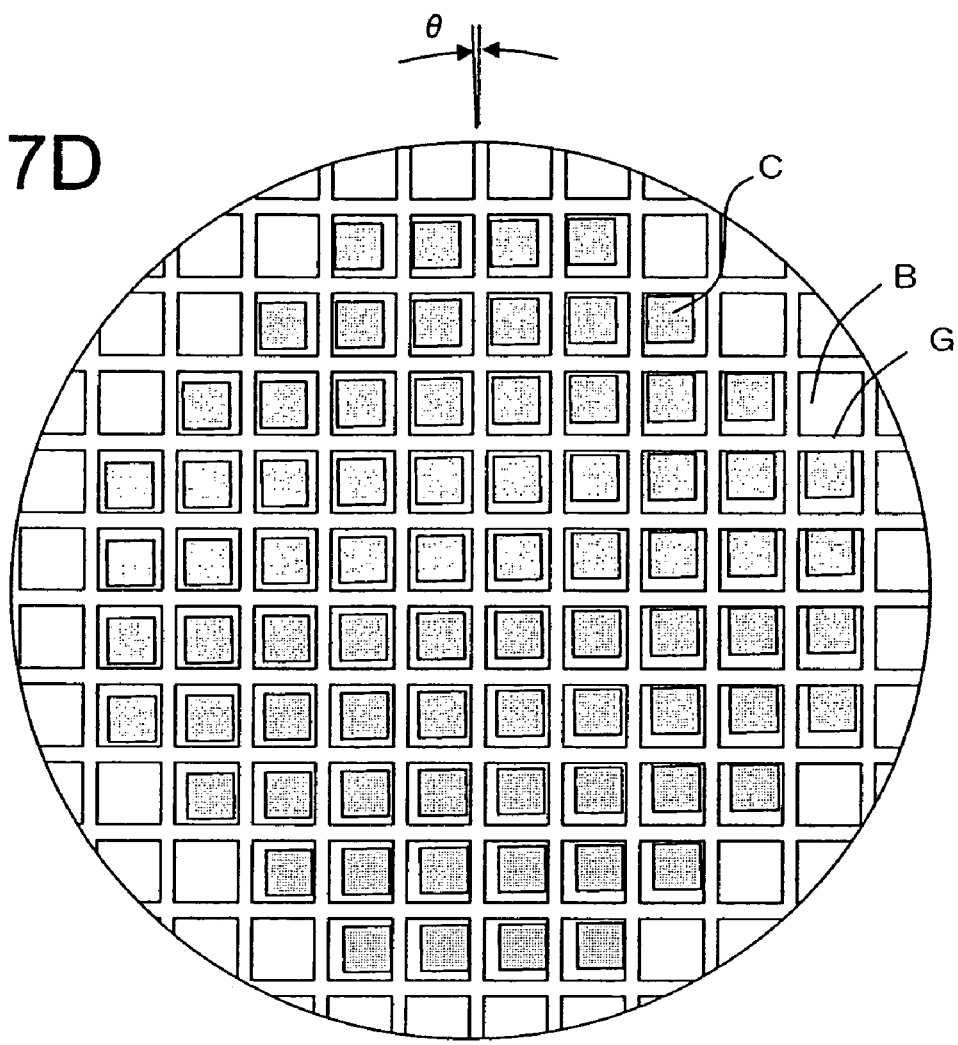

METHOD FOR PRODUCING A THIN IC CHIP USING NEGATIVE PRESSURE

BACKGROUND OF THE INVENTION

1. Field of the Invention

The present invention relates to a method for producing a thin IC chip that is comprised of a thinned wafer and a reinforcing plate, particularly to a method for producing a non-contact type IC card.

2. Description of the Related Art

Silicon wafers of thin film types, which have been introduced into non-contact type IC cards, have been applied to various fields, such as ticket gates of railroads and bankcards. It is expected that thin-film silicon chips will be further applied to various fields, such as IC tags, in the future. A thin-film silicon chip is bonded to a reinforcing plate, which is made of a thin plate of stainless steel or the like, so that the chip is not easily damaged by external forces, because a thin-film silicon chip is extremely brittle in itself.

Various methods for producing IC chips have been proposed. According to a conventional art, first, grooves are formed in a wafer, and then the wafer is diced. In this method, first, grooves that are deeper than the thickness of the finished wafer are formed along chip portions that are formed on the wafer. Then, the wafer is attached to a base plate with an adhesive tape, wax, or the like. The wafer is ground from the back surface to a predetermined thickness and is separated into the chip portions. The separated chip portions are attached to reinforcing plates to produce IC chips. However, this method has the disadvantage that machining stress and strain are caused in the wafer when the back surface is ground, and the chip portions are apt to experience cracks due to external forces. Further, the characteristics of an IC chip, as an element, tends to be more affected as the wafer becomes thinner. Since the chip portions that are separated need to be attached to respective reinforcing plates one by one, time-consuming and low productivity work is required. Grinding and cleaning the back surface of the chip portion is also required for each separated piece.

The stress and strain, which is generated in the back surface of the wafer, can be removed by using physical means, such as milling, or by using wet etching, after the back surface is ground. Specifically, this method is carried out by the following steps. First, a wafer is attached to a base plate, and the wafer is ground. At this step, the wafer is not yet separated into chip portions. After the wafer is ground, the surface that has been ground is etched by wet means using hydrofluoric acid or the like, by milling in vacuum, or by RIE (Reactive Ion Etching) in order to remove the processing strain in the surface that has been ground. It is not preferable that etching is performed after the wafer is separated into chip portions, because the side surfaces of each piece may be damaged by etching.

The wafer, which is thinned and the surface of which is ground and etched, is attached to a base plate, a sheet, or the like, to be diced into chip portions. The separated chip portions are attached to a metal plate one by one. The metal plate is diced to form IC chips. Alternatively, the separated chip portions may be bonded to respective reinforcing plates one by one. However, these methods have the disadvantage that productivity is low.

In order to overcome this disadvantage, a thinned wafer and a reinforcing plate may be bonded together, and the combination thereof may be diced to form each IC chip. However, if the combination of the reinforcing plate and the wafer which are in contact with each other via an uncured adhesive is removed from an apparatus, and a plurality of the combinations are put into a high-temperature furnace together, then the wafer may easily be damaged by external forces, because the wafer that has been thinned and that is held on the reinforcing plate by the uncured adhesive is extremely brittle. Further, since it is difficult to apply the adhesive evenly in a wide area, it is difficult to bond the wafer and the reinforcing plate together while completely preventing air bubbles from entering the adhesive layer. Bubbles often cause chippings that originate from the air bubbles or cracks in a wafer during dicing, leading to worsened yields. Further, in general, metals used for the reinforcing plate, such as stainless steel, are diced with a dicing blade in a different manner as compared to a silicon wafer etc. Therefore, when the combination of the reinforcing plate and the wafer is diced simultaneously, the number of chippings in the wafer may increase, and metal powders may often clog the blade, resulting in serious damage to the surface of the diced wafer. Reduction in the dicing speed of the blade for reducing damage to the surface may significantly worsen productivity. If a reinforcing tape is attached to a wafer prior to dicing in order to dice the wafer in a reinforced state, then a step of peeling the reinforcing tape is necessary after dicing.

SUMMARY OF THE INVENTION

It is an object of the present invention to provide a method for effectively bonding a thin plate to a flat plate and for dicing the thin plate and the flat plate.

It is another object of the present invention to provide a method for effectively bonding a thinned wafer to a reinforcing plate and for dicing the wafer to manufacture an IC chip, while preventing damage to the wafer.

It is yet another object of the present invention to provide an apparatus for effectively bonding a thin plate to a flat plate.

The present invention relates to a method for bonding a first thin plate having a first adhesion surface and a first back surface and a second thin plate having a second adhesion surface and a second back surface by an adhesive, the adhesive being sandwiched between said first adhesion surface and said second adhesion surface. The method comprises the steps of: applying said adhesive to said second adhesion surface of said second thin plate; holding said first thin plate by applying negative pressure to said first back surface, wherein said first thin plate is held at said first back surface, and said first adhesion surface faces downward; holding said second thin plate by applying negative pressure to said second back surface, wherein said second thin plate is held at said second back surface, and said second adhesion surface faces upward; temporarily bonding said first thin plate and said second thin plate by putting said first and second adhesion surfaces into contact with each other, wherein said first thin plate and said second thin plate are held by negative pressure; and bonding said first thin plate and said second thin plate by curing said adhesive, wherein said first thin plate and said second thin plate are temporarily bonded.

In this way, undesired force that may be applied to the first thin plate and the second thin plate can be prevented because of negative pressure that is applied to the first back surface and the second back surface, even if the adhesive is not sufficiently cured when the first thin plate and the second thin plate are held by the negative pressure in a state that the first and second adhesion surfaces are in contact with each other.

Another embodiment of the present invention relates to a method for producing an IC chip that is manufactured by bonding a surface of a chip portion to a reinforcing plate. The method comprises the steps of: forming a wafer in which a plurality of said chip portions are two-dimensionally arranged on a substrate; forming grooves two-dimensionally in said reinforcing plate; bonding said wafer and said reinforcing plate together using the method according to Claim 1, wherein said wafer corresponds to said second thin plate, said reinforcing plate corresponds to said first thin plate, a back surface of a surface of said wafer corresponds to said first adhesion surface, said chip portions being formed on said surface of said wafer, a surface of said reinforcing plate corresponds to said second adhesion surface, said grooves being formed on said surface of said reinforcing plate, wherein centers of said wafer and said reinforcing plate are aligned, and wherein a relative angle between said wafer and said reinforcing plate is adjusted such that each chip portion is included in each corresponding section that is partitioned by said grooves; and dicing a combination of said wafer and said reinforcing plate that are bonded into IC chips, said combination being diced along said grooves.

As described above, in the method for bonding thin plates according to the present invention, thin plates, such as a thinned wafer, can be bonded together in an effective manner while preventing damage to the thin plates, because the thin plates are held by negative pressure. Further, air bubbles are prevented from entering the adhesive because the negative pressure is also applied to the adhesion surface, leading to higher adhesive strength.

The above and other objects, features and advantages of the present invention will become apparent from the following description with reference to the accompanying drawings which illustrate examples of the present invention.

BRIEF DESCRIPTION OF THE DRAWINGS

FIG. 4 is a plan view of a reinforcing plate;
FIG. 7A is an image when the relative angle between the wafer and the reinforcing plate is adjusted;
FIG. 7B is an image when the relative angle between the wafer and the reinforcing plate is adjusted;
FIG. 7D is an image when the relative angle between the wafer and the reinforcing plate is adjusted.

DESCRIPTION OF THE PREFERRED EMBODIMENTS

First Embodiment

Figure 1:
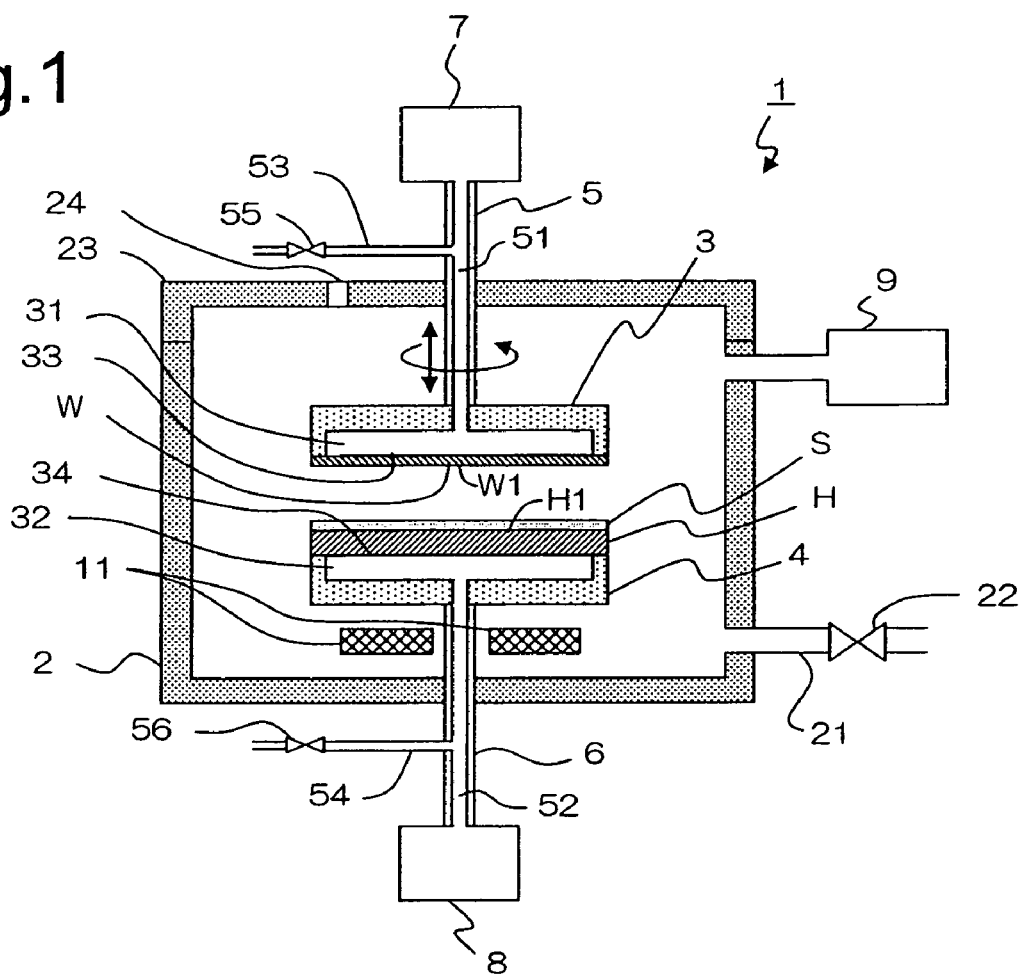
FIG. 1 is a conceptual side cross-sectional view of a bonding apparatus according to the present invention.

Hereinafter, a method for bonding thin plates according to the present invention will be explained with reference to the drawings, taking a method for producing a non-contact type IC card as an example. In this specification, a thin plate includes a film-shape plate or a thin-film plate. FIG. 1 is conceptual side cross-sectional view of a bonding apparatus that is used in the present invention. Bonding apparatus 1 includes air-tight transparent chamber 2 and upper and lower jigs 3, 4 that are arranged in chamber 2. Upper and lower jigs 3, 4 are arranged opposite to each other. Removable lid 23 is arranged on the upper portion of chamber 2. Upper jig 3 is supported by lid 23. Lid 23 is provided with three observatory holes 24 that are arranged at even angle intervals on a virtual circle having upper shaft 5 as the center. Observatory holes 24 do not affect the air-tightness of chamber 2 because the openings of observatory holes 24 are covered with glass. Upper and lower jigs 3, 4 are made of glass, and are provided with openings 33, 34 that are opposite to each other. Upper and lower jigs 3, 4 have concave portions 31, 32, respectively, which define closed spaces when openings 33, 34 are covered with wafer W and reinforcing plate H. Concave portion 31, to which wafer W is attached, has a depth of 0.02 mm or less in order to prevent damage to wafer W due to negative pressure. Upper and lower shafts 5, 6 are connected to concave portions 31, 32, respectively. Upper and lower shafts 5, 6 are arranged at the centers of upper and lower jigs 3, 4, respectively. Upper and lower shafts 5, 6 extend in a vertical direction, and are coaxially aligned. Partition plates may be provided in concave portions 31, 32, as needed, so that wafer W and reinforcing plate H are evenly put in contact with upper and lower jigs 3, 4. Alternatively, the openings of concave portions 31, 32 may be covered with plates having small holes. Upper shaft 5 can move vertically in the axial direction and rotate around the axis with the aid of a driving mechanism, not shown. Lower shaft 6 is fixed. Alternatively, upper shaft 5 may be fixed and lower shaft 6 may be movable. Further, both shafts may be movable. Upper and lower shafts 5, 6 penetrate the top plate and the bottom plate of chamber 2, respectively, via appropriate seal means, not shown. Upper and lower shafts 5, 6 have air passages 51, 52 that are connected to concave portions 31, 32, respectively, inside the shafts.

Bonding apparatus 1 also includes vacuum pumps 7, 8, 9 outside chamber 2. Vacuum pumps 7, 8, 9 may be general rotary vacuum pumps. High performance pumps that provide high vacuum degree are not necessary. Vacuum pump 9 is directly connected to the side wall of chamber 2. Vacuum pumps 7, 8 are connected to air passages 51, 52, respectively.

Vent pipe 21, which can be opened to the atmosphere by opening/closing valve 22, is connected to chamber 2. Vent pipes 53, 54, which can be opened to the atmosphere by opening/closing valves 55, 56, are connected to air passages 51, 52, respectively.

Chamber 2 is further provided with light source 11, which emits light toward lower jig 4, on the back side (lower side) of lower jig 4. Light source 11 may emit light that includes visible light components, similar to natural light, or may emit infrared ray that excels in transmittance. Further, if chamber 2 is a darkroom to interrupt natural light, then a wide variety of light can be used.

Next, explanations are given about the method for producing a non-contact type IC card by using the apparatus. A non-contact type IC card may be produced by thinning a wafer, on which many chip portions are formed, first, dicing the wafer into individual chip portions, and then bonding reinforcing plates to the chip portions. However, according to this method, it is necessary to grind and to clean the surface back of each separated chip portion one by one. Further, the step of attaching a reinforcing tape to the wafer prior to dicing and the step of peeling the reinforcing tape after the wafer is diced in a reinforced state are required, because a thinned wafer is apt to experience flushes and chippings during dicing. For these reasons, it is difficult to improve productivity using the above-mentioned method.

Figure 2:
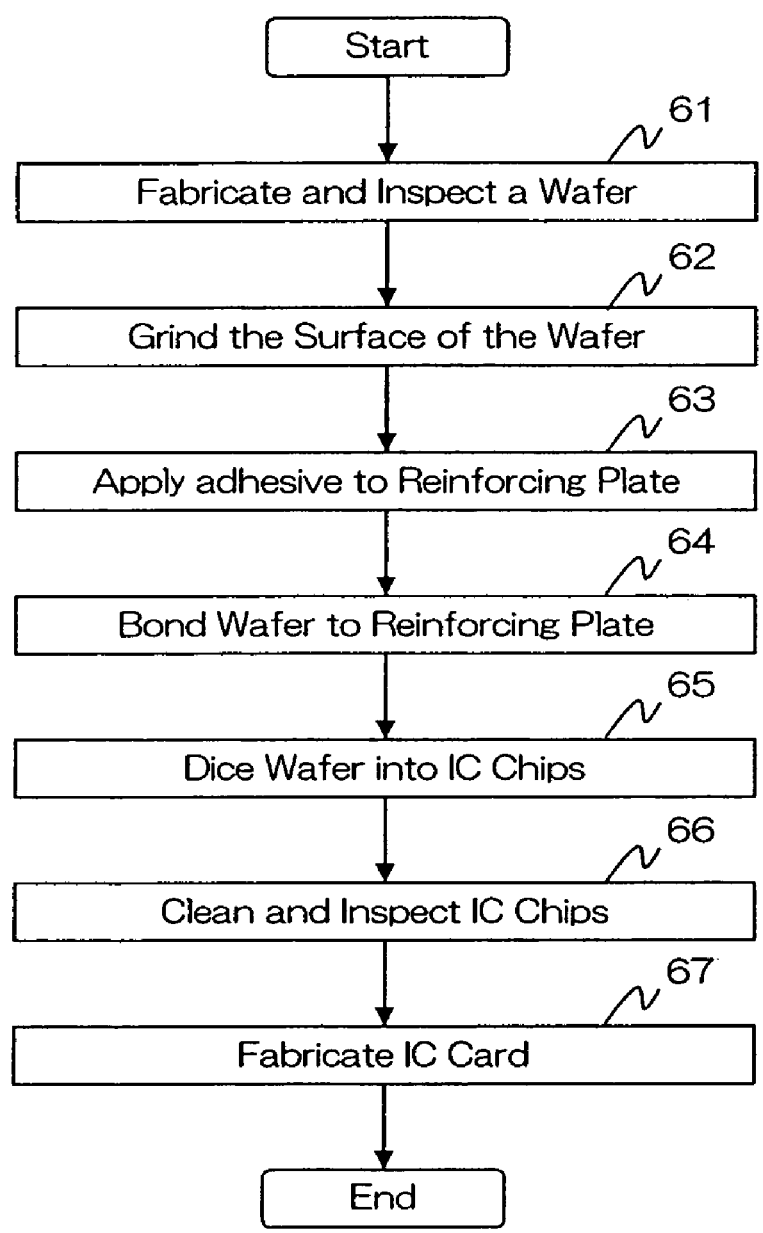
FIG. 2 is a flow chart showing a method for bonding thin plates together according to the present invention.

On the other hand, the method for producing a non-contact type IC card, which will be described below, is characterized in that a wafer is bonded to a reinforcing plate first after it is thinned, and then the wafer is diced into each IC chip together with the reinforcing plate. Therefore, the chip portions can be cleaned all together in the state of a wafer in one operation. Further, since the reinforcing plate is bonded to the wafer prior to dicing, the reinforcing plate also serves as a reinforcing tape. Therefore, the steps of attaching and peeling a reinforcing tape for the purpose of dicing the wafer are not required. Further, as described later, grooves are formed on the reinforcing plate in advance such that the grooves extend in two directions that are orthogonal to each other, and then the wafer and the reinforcing plate are positioned and bonded together such that the chip portions are mounted on the sections that are defined by the grooves. Therefore, it is possible to dice the wafer along the grooves, and rationalization of the production steps is achieved. For these reasons, productivity is significantly improved. Additionally, since the grooves are formed in advance and the amount of dicing is limited, it is expected to minimize the influence on the chip portions that may be caused by the machining strain and the heat during dicing. Hereinafter, detailed explanations are given about the production method with reference to the flow chart in FIG. 2.

Figure 3:
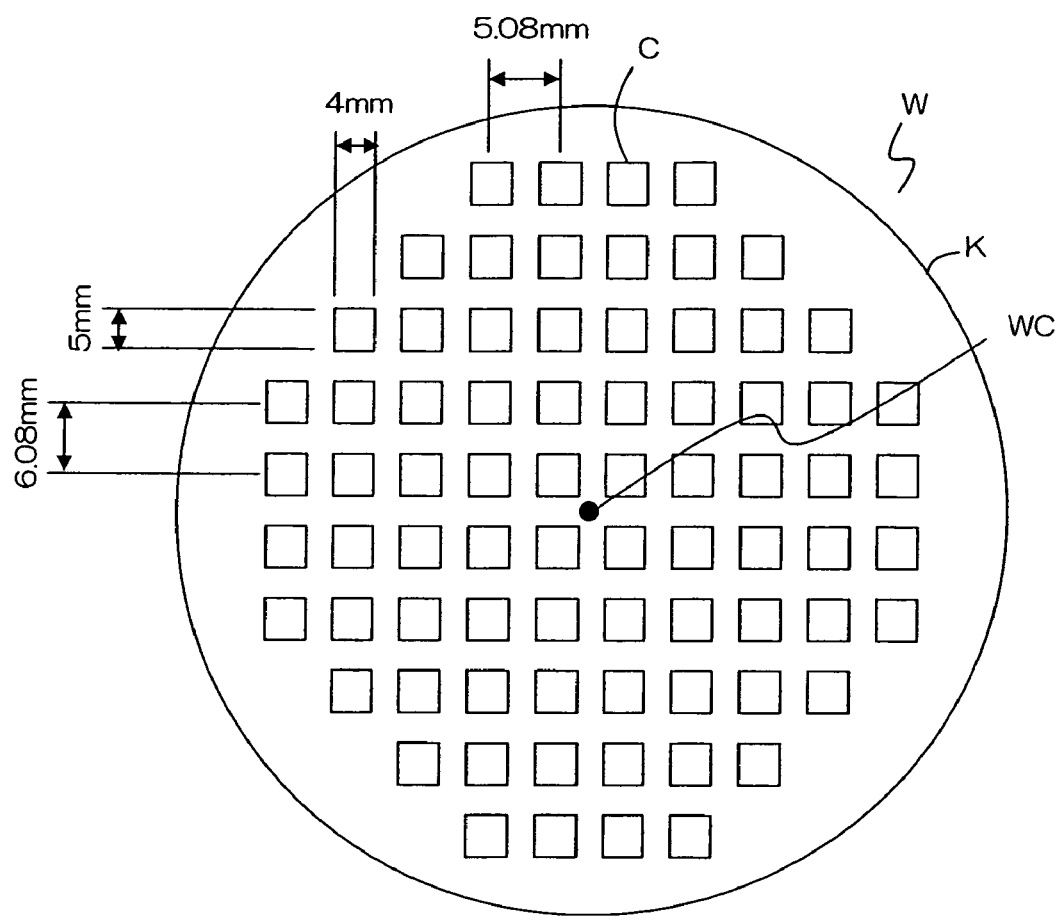
FIG. 3 is a plan view of a wafer.

(Step 61) First, wafer W having many chip portions C that are formed on circular silicon substrate K is manufactured, and then wafer W is inspected for the following steps in order to find wafer W with defects, as needed. FIG. 3 shows a plan view of a wafer. Chip portions C are two-dimensionally formed on circular silicon substrate K. In one embodiment, chip portion C has a size of about 4 mm×5 mm, and the centers of chip portions C are spaced at about 5.08 mm×6.08 mm. The distance between the centers is configured to be equal to the distance between the centers of sections B of reinforcing plate H (described later). Therefore, each chip portion C is included in respective section B when the positions of wafer W and reinforcing plate H are adjusted. Adhesion surface W1 on which wafer W is bonded to reinforcing plate H is the back surface, or the surface that does not have chip portion C, of wafer W.

(Step 62) Then, the back surface, which is adhesion surface W1 of wafer W, is polished. Wafer W, which is about 0.65 mm in thickness in one embodiment, is thinned to some extent by means of mechanical polishing, and then is finished by means of chemical etching to a thickness of, for example, about 0.05 mm.

(Step 63) Then, adhesive S is applied to reinforcing plate H, and reinforcing plate H is mounted on lower jig 4 of bonding apparatus 1. FIG. 4 is a plan view of a reinforcing plate. Reinforcing plate H is a circular thin plate made of stainless steel, and has a diameter that is similar to that of wafer W. Reinforcing plate H is 0.1 to 0.2 mm in thickness. The difference in thickness is not important. Grooves G having the width of about 0.08 mm are two-dimensionally formed on one surface of reinforcing plate H. The width is determined such that the dicing width and a margin for dicing are ensured. Section B that is partitioned by grooves G is about 5 mm×6 mm in size, and therefore the distance between the centers of the adjacent sections B is about 5.08 mm×6.08 mm.

Figure 5A:
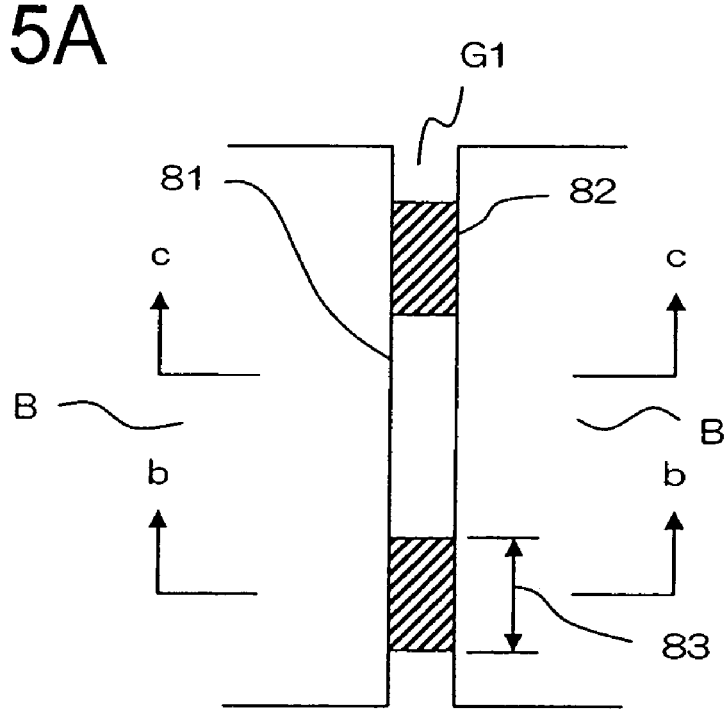
FIGS. 5A to 5C are partial detailed views of a groove of the reinforcing plate.
Figure 5B:
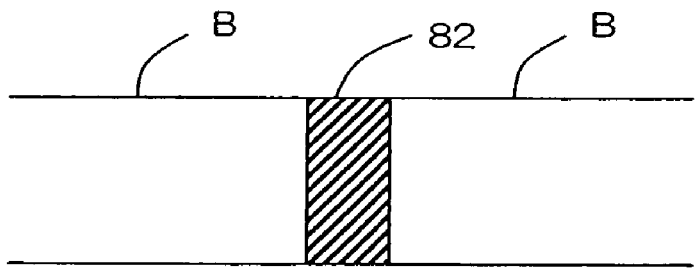
Figure 5C:
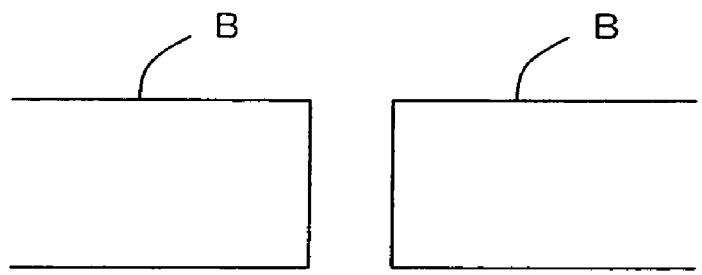
Figure 6A:
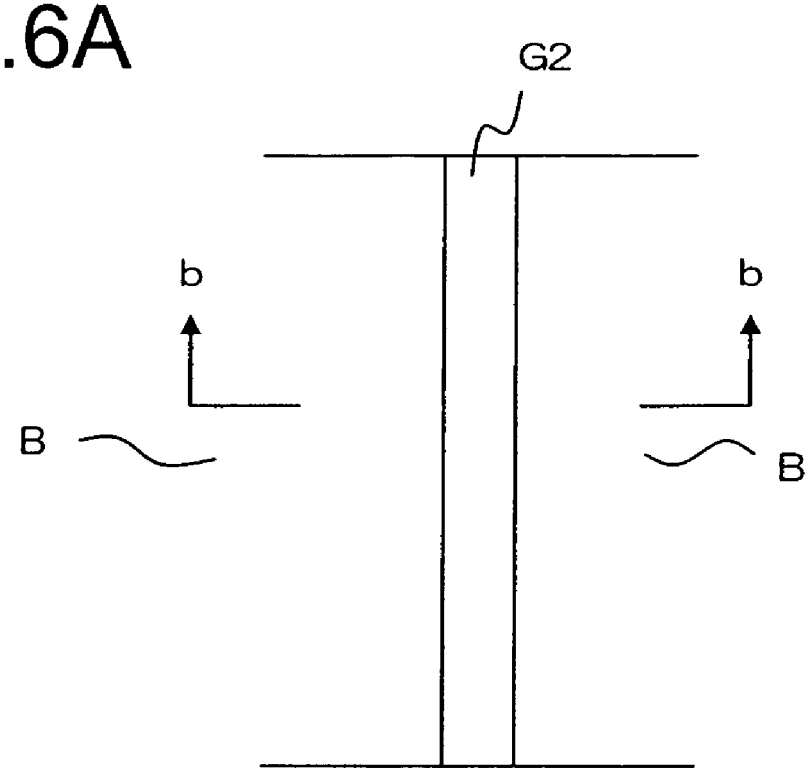
FIGS. 6A and 6B are partial detailed views of a groove of the reinforcing plate.
Figure 6B:
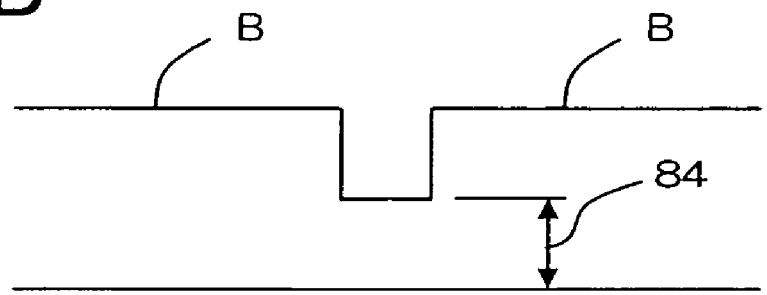

FIGS. 5A to 6B show the structure of the groove in detail. Groove G may be groove G1 that has a slit that penetrates reinforcing plate H, or may be groove G2 that has a portion having a smaller thickness than the surroundings. As shown in detail in FIGS. 5A to 5C, groove G1 has silt 81 that penetrates reinforcing plate H in the thickness direction and two bridge portions 82 that are connected to adjacent sections B. Each bridge portion 82 has the same thickness as reinforcing plate H, and width 83 is about 0.2 to 0.5 mm. FIG. 5A is a plan view of groove G1, and FIGS. 5B-5C are cross-sectional views taken along lines b-b and c-c in FIG. 5A, respectively (same for FIGS. 6A-6B). As shown in detail in FIGS. 6A to 6B, groove G2 is formed such that the portion adjacent to each side of section B has a smaller thickness than reinforcing plate H. Groove G2 preferably has thickness 84 of 0.03 mm or less, because stainless steel tends to have flushes due to extremely poor dicability and it is desirable to limit thickness 84 as small as possible in order to prevent wear and damage to the grindstone. Further, groove G1 may have a large number of bridge portions that are intermittently arranged, like a perforated line, in a modified embodiment. In this case, the width of each bridge portion that forms the perforated line is preferably 0.15 mm or less, and more preferably 0.08 mm or less. Grooves G1, G2 reduce the amount of grooves that is diced and improves dicing speed.

This step is performed by the following sub-steps in detail. First, adhesive S is applied to adhesion surface H1 of reinforcing plate H by means of the screen printing technique. The thickness of the adhesive that is applied is, for example, about 0.005 to 0.04 mm, although it depends on the thickness of reinforcing plate H. Since epoxy resin is liquid at room temperatures, the adhesive can be evenly applied by the screen printing technique. Then, the surface of the applied epoxy resin is kept as is for a predetermined time so that adhesive S is half-cured. The adhesive strength of the adhesive can be enhanced by putting adhesive S in a half-cured condition. The adhesive strength is weaker than the final adhesive strength that is achieved after cure. However, the adhesive strength is stronger than the adhesive strength that is obtained immediately after the adhesive is applied. Accordingly, the adhesive strength that is obtained is sufficient for removing the combination of wafer W and reinforcing plate H from chamber 2 in a temporarily bonded state.

In order to confirm whether adhesive S has been half-cured or not, a dummy thin film that is similar to the chip portion may be provided on the peripheral region of the wafer, which is not related to the bonding of the chip portion. The adhesive strength can be checked by moving the thin film or by observing the manner in which the adhesive is deformed.

Additionally, if reinforcing plate H with grooves G1 is used, then it is preferable to use adhesive S having large viscosity and large surface tension. By doing so, adhesive S, which is applied to the entire surface of adhesion surface H1 of reinforcing plate H including groove G1, forms bridges between adjacent sections B to fill groove G1 without dropping downwards from groove G1 because of the viscosity and the surface tension. This allows negative pressure to be effectively applied to the back surface of adhesion surface H1 of reinforcing plate H, as will be described later. The viscosity of adhesive S is preferably 35000 mPa·s or more at 25° C. Additionally, even if adhesive S reaches the back surface, adhesive S can be easily removed by a general solvent of alcohol series or ketone series before reinforcing plate H is put in chamber 2 or after it is removed from chamber 2, because adhesive S is not completely cured. Further, adhesive S that may adhere to the side surfaces of the grooves is also removed, while reinforcing plate is diced by a grindstone, because the side surfaces of the grooves are rubbed with the grindstone except for the bridge portions.

Then, lid 23 of chamber 2 is opened, and reinforcing plate H to which adhesive S is applied is put into chamber 2. Reinforcing plate H is set on lower jig 4. If reinforcing plate H with grooves G2 is used, then reinforcing plate H is set such that the surface having grooves G2 face upward as adhesion surface H1 that is attached to wafer W. If reinforcing plate H with grooves G1 is used, then either side may face upward because the surface with grooves G1 faces upward no matter whichever surface faces upward.

Then, wafer W is attached to upper jig 3 such that the surface having chip portions C faces upper jig 3. The angle relative to reinforcing plate H is roughly adjusted by using an orientation flat of wafer W, or the straight line that is formed on a part of the peripheral region of the wafer.

Then, valves 55, 56 are closed and vacuum pumps 7, 8 are actuated in order to suck air in concave portions 31, 32 via air passages 51, 52. As a result of the operation, wafer W and reinforcing plate H stick to and are held by upper jig 3 and lower jig 4, respectively.

(Step 64) Next, wafer W is bonded with reinforcing plate H. First, lid 23 is set on chamber 2 in the state that wafer W is held by upper jig 3. Since lid 23 can be accurately positioned relative to chamber 2, wafer W and reinforcing plate H face each other, with the centers thereof being aligned. Then, lid 23 is closed, and the relative angle between wafer W and reinforcing plate H is adjusted. Specifically, light source 11 is activated to irradiate lower jig 4 with light from the back side. Lower jig 4, which is relatively thick, but is made of glass, lets the light pass through. Reinforcing plate H that is arranged on lower jig 4 does not let al. sufficient amount of light pass through the general portions. However, reinforcing plate H allows part of the light to pass through grooves G1 (In the case of groove G2, part of light passes through grooves G2 that are thinned.). Adhesive S made of epoxy resin on reinforcing plate H, which is also optically transparent, transmits the light. Wafer W, which is arranged above adhesive S with space therebetween and which is thinned to about 0.05 mm, transmits part of light. However, the portions in which chip portions C are formed create shadows due to the irradiation of light, because the portions are somewhat thicker than the surroundings. Further, upper jig 3 transmits the light, similar to lower jig 4. Accordingly, when viewed from observatory holes 24 toward light source 11, the bright image of grooves G of reinforcing plate H and the shadows of chip portions C are observed as an overlapped image, as shown in FIG. 7A. At this time, relative angle θ between wafer W and reinforcing plate H is usually an angle other than 0. Additionally, portions that can be actually viewed from observatory holes 24 are limited to the portions that are indicated by the circles in FIG. 7A. However, since at least one entire section B can be viewed from each observatory hole 24 by using observatory hole 24 having a sufficiently larger diameter than section B, and since at least three observatory holes 24 are used for the observation, relative angle θ can be correctly recognized.

Next, upper jig 3 is lowered, and is stopped at a position at which wafer W and reinforcing plate H are spaced with a small gap. Upper jig 3 is rotated about upper shaft 5 in order to adjust relative angle θ between wafer W and reinforcing plate H. Specifically, while the orientation of grooves G of reinforcing plate H and the orientation of chip portions C are observed, upper jig 3 is rotated to an angle at which each chip portion C is enveloped by corresponding section B, or at which the entire chip portion C is included in section B. In this way, since the relative angle between wafer W and reinforcing plate H can be adjusted by means of light, this method does not require any special devices except for light source 11 and observatory holes 24, and is very inexpensive. Further, since the relative angle between wafer W and reinforcing plate H can be adjusted while wafer W and reinforcing plate H are directly viewed, this method allows visual, direct, and highly accurate adjustment.

Figure 7C:
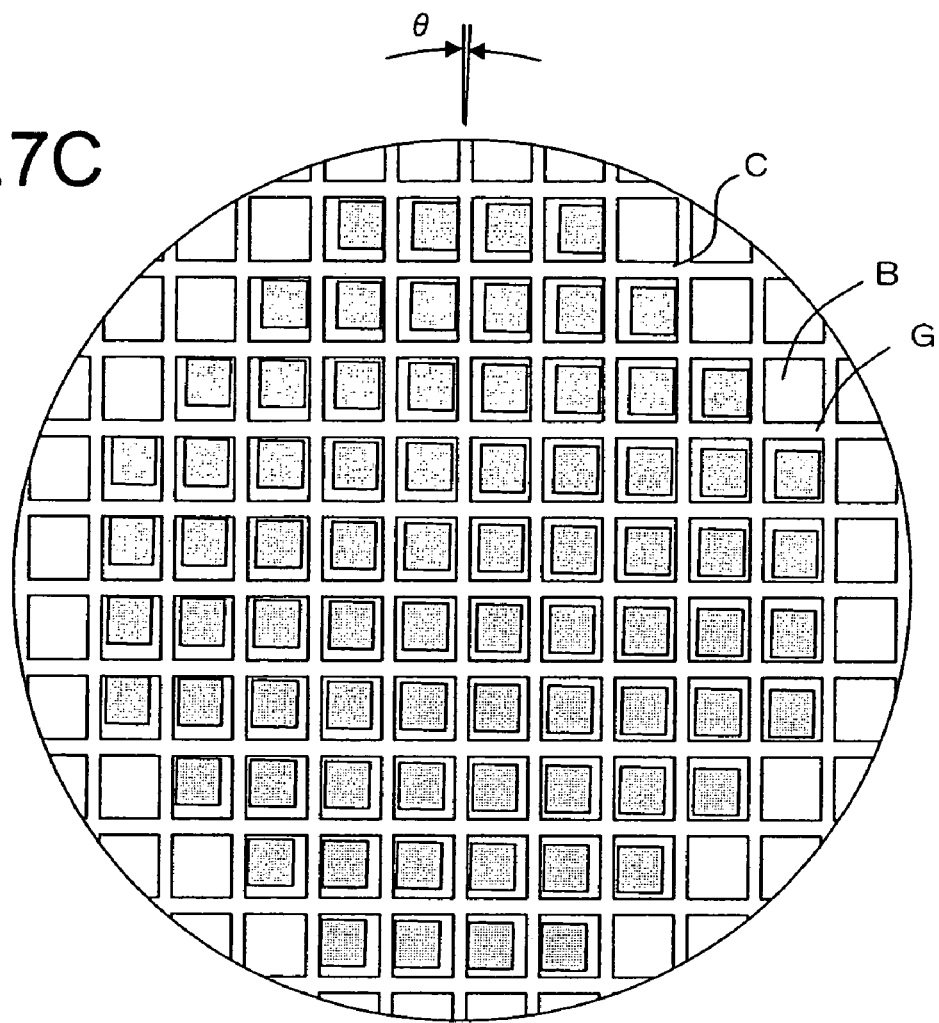
FIG. 7C is an image when the relative angle between the wafer and the reinforcing plate is adjusted.

FIG. 7B shows a state in which both angles are accurately adjusted and relative angle θ is set to 0. If a grindstone having a thickness of, for example, 0.03 mm is used, wafer W is actually diced into IC chips with a dicing width of about 0.04 to 0.05 mm. Since the width of groove G is about 0.08 mm, dicing margins of about 0.015 to 0.02 mm can be ensured on both sides of the dicing width. Accordingly, precise adjustment is not necessary because relative angle θ can be adjusted within the margin. Therefore, as shown in FIGS. 7C and 7D, relative angle θ may be somewhat biased from 0 degree.

Wafer W and reinforcing plate H, which are circles in this embodiment, may have any shape other than circles. Specifically, wafer W and reinforcing plate H are only required to satisfy the relationship that the projected image of each chip portion is included in the corresponding section that is defined by grooves when the center points of a wafer and a reinforcing plate, which are determined in advance, are aligned and the wafer and the reinforcing plate are overlapped at a predetermined angle.

Next, valve 22 is closed and vacuum pump 9 is actuated to lower the pressure in chamber 2. This operation is performed mainly for the purpose of preventing air from entering microscopic asperities on the surface of adhesive S. Specifically, adhesive S is not completely flat due to the traces of a mesh of the screen printing that remain in the form of asperities. If wafer W comes into contact with adhesive S in this state, the air that remains in the concaves cannot be removed, and bubbles remain on the surface that adheres to wafer W, resulting in serious influence on the adhesive strength. Since the air in the concaves is removed by negative pressure, bubbles are less apt to remain. This operation is also performed in order to remove air in adhesive S by negative pressure. Air in adhesive S can be removed by applying negative pressure, although adhesive S is half-cured.

Then, upper jig 3 is further lowered to put wafer W in contact with reinforcing plate H. As a result of the operation, wafer W and reinforcing plate H are temporarily bonded together by adhesive S which is desired and which has adhesive strength of some degree.

Then, vacuum pumps 7, 8, 9 are stopped, and valves 22, 55, 56 are opened to release vent pipes 21, 53, 54 to the atmosphere so that chamber 2 and concave portions 31, 32 are returned to atmospheric pressure. As a result, the sticking force between wafer W and upper jig 3 and the sticking force between reinforcing plate H and lower jig 4 is lost, and wafer W and reinforcing plate H are released from the jigs. On the other hand, since wafer W and reinforcing plate H are temporarily bonded by adhesive S, wafer W and reinforcing plate H can be removed from chamber 2 in a temporarily bonded state. Since the sticking force on wafer W is released by releasing the negative pressure, undesired force is not applied to wafer W from upper jig 3.

Then, the combination of wafer W and reinforcing plate H that are temporarily bonded is put into a high-temperature furnace and is heated for a predetermined time at a predetermined temperature. As an example, when the combination was heated at 120° C. for 2 hours, it was confirmed that sufficient adhesive strength was achieved.

(Step 65) Next, the combination of wafer W and reinforcing plate H is two-dimensionally diced along grooves G of reinforcing plate H. The combination may be held by a dicing plate prior to dicing. As described above, since the amount of dicing is limited because of grooves G which are formed in reinforcing plate H, improvement in the dicing speed and in the lifetime of a grindstone can be achieved. In this way, the combination of wafer W and reinforcing plate H is separated into IC chips that are provided with reinforcing plates.

(Step 66) Next, the IC chip is cleaned, the dicing plate is removed, and visual inspection is performed.

(Step 67) Next, the finished IC chip is mounted on an antenna substrate together with a communicating antenna. Then a protection film for covering the IC chip and the communicating antenna is formed. The protection film and the antenna substrate are covered with a housing sheet to complete a non-contact type IC card.

Now, the condition for getting the half-cured state of adhesive S is supplemented. It is not desirable that sufficient final adhesive strength can not be obtained for the reason that adhesive S experiences the half-cured state, and it is necessary to achieve sufficient adhesive strength in a later curing step. In this specification, the desired half-cured state is defined to be the half-cured state after which sufficient adhesive strength can be obtained by heating at 120° C. for 2 hours. Study was performed to find the conditions for getting the desired half-cured state. As a result, it was found that various combinations of heating temperature and heating time can be selected in order to obtain the desired half-cured state. For instances, the above condition is achieved by heating at 120° C. for 15 minutes, heating at 100° C. for 20 minutes, heating at 90° C. for 30 minutes, and heating at 80° C. for 45 minutes. The above condition is also achieved by keeping the adhesive at 25° C., which is room temperature, for 300 minutes.

Next, the negative pressure (the vacuum degree) that is required is explained. Vacuum in chamber 2 is used to release bubbles in adhesive S. In one embodiment, about 46 KPa according to the absolute pressure (the vacuum degree of about 400 mmHg) is enough for the required negative pressure. In one example, about 14.8 KPa (the vacuum degree of about 650 mmHg) was used. Vacuum is also used to attach the reinforcing plate to lower jig 4 and to attach and to fix the wafer to upper jig 3. A differential pressure of about 6700 Pa (50 mmHg) relative to the pressure in chamber 2 is enough. In one embodiment, about 8 KPa (700 mmHg) was used. In this way, since the vacuum degree does not need to be so high, valve 22 may be partially opened if the vacuum degree is too high because of the performance and the capacity of vacuum pump 6, the volume of chamber 2, or the air-tightness of chamber 2. Further, since vacuum pumps 7, 8 are arranged in order to provide a differential pressure relative to chamber 2, it is desirable that the vacuum degree is set low when vacuum pumps 7, 8 are actuated, and the vacuum degree in the jigs for attaching the wafer and the reinforcing plate is gradually increased when vacuum pump 6 is actuated.

Second Embodiment

The second embodiment, similar to the first embodiment, aims to provide a method for bonding a thinned wafer and a thin plate together and for dicing them in an efficient manner while preventing damage to the thinned wafer. In the following explanations, descriptions common to the first embodiment will be omitted, as needed.

Steps 61, 62 are common to the first embodiment. Grooves G are formed in advance on reinforcing plate H, or on the second thin plate, made of stainless steel etc. The locations where grooves G are formed correspond to wafer W, or the first thin plate. Grooves G are formed in a width that is similar to the dicing width for wafer W. Groove G is filled with adhesive S, and serves as a hole through which bubbles pass during bonding in vacuum, which prevents the generation of air bubbles. Groove G serves as a reference line for positioning wafer W.

(Step 63')

Reinforcing plate H is attached to lower jig 4 with negative pressure, and adhesive S is applied to reinforcing plate H. Reinforcing plate H is preferably formed slightly larger than wafer W so that the locations of the grooves of reinforcing plate H can be viewed from above to facilitate the positioning of the wafer. Grooves G of reinforcing plate H may also be viewed from the sides of reinforcing plate H. Reinforcing plate H that is larger than wafer W also prevents adhesive S from seeping out of reinforcing plate H and from adhering to lower jig 4.

Then, wafer W is attached to upper jig 3, with the surface having chip portions C facing opening 33, and inside space of opening 33 is made to negative pressure. Wafer W is held by upper jig 3 with the negative pressure. Since wafer W is thinned to about 0.05 mm by means of chemical etching and is apt to have damage if it is handled alone, wafer W is preferably reinforced. In one embodiment, a double-faced tape that can be peeled by the radiation of ultraviolet ray (UV) is attached to the surface that is chemically etched, and an optically transparent substrate is attached to the tape. Glass, glass ceramic, quartz, or the like may be used as an optically transparent substrate. The optically transparent substrate may have any thickness as long as it is resistant to damage in ordinary handling. As an example, a glass substrate having a thickness of 2 mm is used for a wafer of 6"φ. The optically transparent substrate is peeled by irradiating ultraviolet ray after wafer W is attached to upper jig 3. Alternatively, if a double-faced tape other than a UV peelable type is used, then the tape may be peeled by solvent. In this way, thinned wafer W can be attached to upper jig 3 without experiencing damage because it is reinforced by the optically transparent substrate etc.

Then, the positioning of wafer W and reinforcing plate H is performed. Since the central axes of upper jig 3 and lower jig 4, which are arranged opposite to each other, are aligned, the central axis of wafer W that is attached to upper jig 3 and the central axis of reinforcing plate H that is attached to lower jig 4 are also aligned. Therefore, only adjustment of the relative angle between wafer W and reinforcing plate H is required at this step. Wafer W, which is usually thinned to about 50 μm, is transparent because light passes through a wafer having thickness of 100 μm or less. Accordingly, if upper jig 3 is made of transparent materials, such as glass or transparent ceramic, then grooves G of reinforcing plate H can be visually recognized through wafer W from above. The partitions of chip portions C can easily be overlapped with grooves G of reinforcing plate H by relatively rotating wafer W, which is attached to upper jig 3, and reinforcing plate H, which is attached to lower jig 4, while visually recognizing wafer W from above. A hole may be provided in a part of upper jig 3 to recognize the grooves in order to position chip portions C relative to grooves G while viewing them through the hole.

Then, step 64 and subsequent steps are performed. Upper jig 3 and lower jig 4 are arranged in chamber 2 such that the space therebetween can be adjusted. When chamber 2 is exhausted with a predetermined exhausting rate and the solvent or the like is removed from adhesive S, the space between upper jig 3 and lower jig 4 is decreased to bond wafer W and reinforcing plate H together. By keeping differential pressure of 6700 Pa or more between the negative pressure in chamber 2 (on the adhesion surface) and the negative pressure in the openings of upper jig 3 and lower jig 4, air bubbles are prevented from entering adhesive S while wafer W and reinforcing plate H can be held by the negative pressure.

Wafer W and reinforcing plate H are temporarily bonded by heating at 200° C. for several to 10 minutes. The combination of wafer W and reinforcing plate H which are temporarily bonded can be removed when the negative pressure for upper jig 3 and lower jig 4 is released and space between upper jig 3 and lower jig 4 is made. The combination of reinforcing plate H and wafer W is completely cured by heating at 200° C. or more for one hour under normal pressure. Sufficient strength for practical use is achieved by keeping the combination at room temperature of 25° C. for 300 minutes. Needless to say, the combination may be heated at high temperature in a vacuum chamber and may be completely cured in the vacuum chamber.

At step 65, it is preferable that only wafer W is diced first by a blade having a thickness that is equal to or smaller than that of the groove of reinforcing plate H, and then reinforcing plate H is diced by a blade having a thickness that is narrower than the dicing width of wafer W that has been diced. By using a blade that is suitable for wafer W, chippings along the dicing surface of wafer W are prevented, and influence on the chip portions is reduced. Further, since wafer W can be diced at a high speed, productivity is improved. By using a blade suitable for reinforcing plate H, reinforcing plate H can be diced at a high speed. As a result, although the number of steps is increased, the time for dicing is substantially shortened. By applying a dicing protection sheet that excels in adhesiveness to wafer W in order to dice wafer W, chippings can be further prevented. Additionally, by using adhesive S that contains filler, such as Ag or silicon, chippings in the wafer can be significantly reduced because of the reduction in strain that is caused by adhesion. This adhesive is effective to improve yield for wafers whose yield is reduced even by slight mechanical strain, such as wafers for sensors etc.

The advantages of the present invention are summarized as follows.

First, in order to bond a thinned wafer to a reinforcing plate, air in the adhesive is removed by vacuum and the wafer and the reinforcing plate are put into contact, while the wafer is held by the jig with negative pressure. Therefore, the wafer is less apt to experience undesired force after being put into contact with the reinforcing plate, leading to a smaller possibility of damage. Since the wafer is held with negative pressure, the wafer can be held flat even if the wafer is warped by stress that is caused when the wafer is thinned. Further, since the adhesive is kept for a predetermined time for half-curing before the wafer and the reinforcing plate are put into contact, adhesive strength can be obtained to some extent before curing the adhesive with heat, thereby allowing the combination of the wafer and the reinforcing plate to be transferred in a temporarily bonded state. Therefore, the combination of the wafer and the reinforcing plate can be put into another high-temperature furnace and can be cured at high temperature. The efficiency of operations can be improved by this and other effects which are mentioned above. Further, the positioning of the wafer and the reinforcing plate for bonding can be performed only by adjusting the relative angle between the wafer and the reinforcing plate. When grooves are formed in the reinforcing plate in advance, positioning in two directions of x, y is necessary. However, only the relative angle needs to be adjusted because the central axes are aligned to each other, resulting in a reduction in adjusting work and the cost of the apparatus.

Further, according to the present invention, a wafer is thinned and bonded to a reinforcing plate, and then the combination of the wafer and the reinforcing plate is diced in two steps. This method is advantageous in that the entire combination can be diced at a high speed, though the dicing requires two operations. Further, cleaning can be performed in one operation in the state of a wafer. Since the wafer is bonded to the reinforcing plate prior to dicing, and the reinforcing plate functions as a protection tape, dicing that does not cause practical problems, that prevents chippings, that achieves high yield, and that does not need an additional protection tape can be provided. Moreover, grooves are formed in the reinforcing plate in two directions that are orthogonal to each other in advance, and the wafer and the reinforcing plate are positioned and bonded such that the chip portions are mounted on the sections that are surrounded by the grooves. Therefore, the dicing steps can be rationalized because dicing can be performed along the grooves. For these reasons, productivity can be significantly improved.

As described above, detailed explanations are given about the embodiments of the present invention, which are applied to the method for bonding a thinned wafer to a reinforcing plate. However, the present invention can be widely applied to embodiments in which a thinned wafer is bonded to a plate of any shape. For example, if the steps of thinning a wafer first, then separating the wafer into chip portions, and then attaching each chip portion to the reinforcing plate, as described above, are performed, then it is necessary to attach a reinforcing tape to the wafer in advance in order to dice the thinned wafer. In this case, the reinforcing tape, though it is thinner than the above-mentioned reinforcing plate, can be attached to the wafer in a manner as described above. Further, the present invention can be applied to a method for producing a hybrid IC of a piggyback type, in which ICs are bonded with each other.

Although a certain preferred embodiments of the present invention have been shown and described in detail, it should be understood that various changes and modifications may be made without departing from the spirit or scope of the appended claims.

What is claimed is:

1. A method for producing an IC chip that is manufactured by bonding a surface of a chip portion to a reinforcing plate, comprising:

forming a wafer on which a plurality of said chip portions are two-dimensionally arranged, and on which a plurality of surrounding portions that surround the chip portions are arranged, the surrounding portions being thinner than the chip portions;

forming grooves two-dimensionally in said reinforcing plate; and bonding said wafer and said reinforcing plate together using a method for bonding the wafer having a first adhesion surface and a first back surface and the reinforcing plate having a second adhesion surface and a second back surface by an adhesive, the adhesive being sandwiched between said first adhesion surface and said second adhesion surface, the bonding comprising:

applying said adhesive to said second adhesion surface of the reinforcing plate;

holding the wafer by applying negative pressure to said first back surface, wherein the wafer is held at said first back surface, and said first adhesion surface faces downward;

holding the reinforcing plate by applying negative pressure to said second back surface, wherein the reinforcing plate is held at said second back surface, and said second adhesion surface faces upward;

temporarily bonding the wafer and the reinforcing plate by putting said first and second adhesion surfaces into contact with each other, wherein the wafer and the reinforcing plate are held by negative pressure; and bonding the wafer and the reinforcing plate by curing said adhesive, wherein the wafer and the reinforcing plate are temporarily bonded, centers of said wafer and said reinforcing plate being aligned, and a relative angle between said wafer and said reinforcing plate being adjusted such that each chip portion is included in each corresponding section that is partitioned by said grooves; and dicing a combination of said wafer and said reinforcing plate that are bonded into IC chips, said combination being diced along said grooves, wherein the temporarily bonding the wafer and the reinforcing plate comprises:

projecting light that passes through the surrounding portions of said wafer and said grooves of said reinforcing plate from a side of said reinforcing plate, the chip portions of the wafer creating shadows by being thicker than the surrounding portions; and adjusting said relative angle while visually recognizing light that is transmitted through the grooves of said reinforcing plate and recognizing the shadows of said chip portions from the side of said reinforcing plate, the light being transmitted and the shadows being generated by projection of light, and the transmitted light includes visible light components.

2. The method according to claim 1, wherein said step of temporarily bonding the wafer and the reinforcing plate comprises applying negative pressure to said first and second adhesion surfaces, said negative pressure having a vacuum degree that is lower than that of the negative pressure that acts on said first and second back surfaces.

3. The method according to claim 2, wherein a differential pressure between the negative pressure that acts on said first and second adhesion surfaces and the negative pressure that acts on said first and second back surfaces is 6700 Pa or more.

4. The method according to claim 1, wherein said step of temporarily bonding the wafer and the reinforcing plate comprises putting said first and second adhesion surfaces into contact with each other after said adhesive is half-cured.

5. The method according to claim 1, wherein the reinforcing plate is a circular plate having a larger radius than the wafer.

6. The method according to claim 1, wherein said adhesive includes filler.

7. The method according to claim 1, wherein said step of forming said wafer comprises grinding said wafer to a thickness of 100 μm or less, and wherein said step of temporarily bonding the wafer and the reinforcing plate comprises adjusting said relative angle while visually recognizing said wafer and said grooves of said reinforcing plate from a side of said wafer, said grooves being viewed through said wafer.

8. The method according to claim 1, wherein said step of dicing said combination comprises:

dicing the wafer and said adhesive with a blade having a thickness that is equal to or less than a thickness of said grooves of the reinforcing plate, and dicing the reinforcing plate with a blade having a thickness that is smaller than a thickness of a diced portion, said diced portion being generated in the wafer and said adhesive.

9. The method for producing the IC chip according to claim 1, further comprising a step of applying a dicing protection sheet to a surface of the wafer prior to said step of dicing said combination, said surface of the wafer being opposite to a surface which is bonded to the reinforcing plate.

10. A method for producing a non-contact type IC card, comprising the steps of:

producing an IC chip using the method according to claim 1;

mounting said IC chip on an antenna substrate together with a communicating antenna;

forming a protection film on said antenna substrate, said protection film covering said IC chip and said communicating antenna; and covering said protection film and said antenna substrate by a housing sheet.

* * * * *